United States Patent
Chang

[19]

[11] Patent Number: 6,130,131
[45] Date of Patent: Oct. 10, 2000

[54] METHOD FOR FABRICATING A FLASH MEMORY

[75] Inventor: Kuang-Yeh Chang, Taipei, Taiwan

[73] Assignee: United Microelectronics Corp., Hsinchu, Taiwan

[21] Appl. No.: 09/128,814

[22] Filed: Aug. 4, 1998

[30] Foreign Application Priority Data

Jun. 8, 1998 [TW] Taiwan ................................. 87109054

[51] Int. Cl.$^7$ ............................................... H01L 21/8247
[52] U.S. Cl. ............................................ 438/263; 438/594
[58] Field of Search ...................................... 438/262, 263, 438/264, 266, 267, 307, 529, 593, 594

[56] References Cited

U.S. PATENT DOCUMENTS

| | | | |
|---|---|---|---|
| 5,427,970 | 6/1995 | Hsue et al. ................................. | 438/594 |
| 5,510,284 | 4/1996 | Yamauchi ................................. | 438/257 |
| 5,877,054 | 3/1999 | Yamauchi ................................. | 438/264 |
| 5,882,970 | 3/1999 | Lin et al. ................................. | 438/529 |

*Primary Examiner*—Chandra Chaudhari
*Attorney, Agent, or Firm*—Thomas, Kayden, Horstemeyer & Risley

[57] ABSTRACT

A method for fabricating a flash memory forms a diffusion region in the substrate at one side of the first polysilicon layer. Formation of the diffusion region is preceded by a number of steps. First, the first polysilicon layer is patterned. Then, an implantation step is performed to self-align the polysilicon layer, thereby forming implantation regions in the substrate at both sides of the first polysilicon. One of these implantation region is used for a buried bit line. Subsequently, a dielectric layer is formed over the first polysilicon layer, and the second polysilicon layer is patterned to form a control gate and the first polysilicon layer is further patterned to form a floating gate.

15 Claims, 5 Drawing Sheets

METHOD FOR FABRICATING A FLASH MEMORY

CROSS-REFERENCE TO RELATED APPLICATION

This application claims the priority benefit of Taiwan application serial no. 87109054, filed Jun. 8, 1998, the full disclosure of which is incorporated herein by reference.

BACKGROUND OF THE INVENTION

1. Field of the Invention

This invention relates to a method for fabricating memory, and more particularly, to a method for fabricating flash memory.

2. Description of Related Art

Electrically erasable programmable read-only-memories (EEPROMs) are widely used as memory components for personal computers and electronic equipment. A conventional EEPROM memory cell comprises a floating gate transistor structure that is programmable, erasable and able to store data. However, the conventional EEPROM suffers from a slow storage and retrieval time of typically around 150–200 ns. Recently, a faster EEPROM, for example, a flash memory, has been developed with a storage and retrieval time of about 70–80 ns.

A conventional floating gate transistor relies on hot electrons and Fowler-Nordheim tunneling to store and erase data. For example, when the flash memory stores data, a high voltage, on the order of 8 volts, is applied between the source region and the drain region. A high voltage is also applied to the control gate. Hot electrons generated near the drain region will flow toward the floating gate through the tunneling oxide layer. By this mechanism, the threshold voltage of the floating gate transistor is raised to store data.

When the data is to be erased, a negative voltage is applied to the control gate and a positive voltage applied to the source region. The electrons trapped in the floating gate tunnel through the tunneling oxide layer to erase the data, and the floating gate returns to the uncharged state. In the erasing process, the erasing time takes a long time to ensure the uncharged state of the floating gate.

FIG. 1 is a schematic layout of a conventional flash memory. FIGS. 2 to 4 are cross-sectional views taken along the line I—I in FIG. 1, schematically illustrating the fabrication process. FIGS. 5 to 6 are cross-sectional views taken along the line II—II in FIG. 1, schematically illustrating the fabrication process. The manufacturing method of the conventional flash memory is described below.

In FIGS. 2 and 5 a pad oxide layer (not shown) is first formed by thermal oxidation on a substrate 10. Active regions are then defined by forming field oxide layer 14, using local oxidation. The pad oxide layer is then removed by wet etching. Next, a tunneling oxide layer 12 with a thickness of about 100 Å is formed on the surface of the device regions by thermal oxidation. Then, a polysilicon layer is formed on the tunneling oxide layer 12 by low pressure chemical vapor deposition (LPCVD). The polysilicon layer is then defined by photolithography and etching to form a polysilicon layer 16 with a thickness of about 1500 Å.

Next, an inter-poly dielectric layer is formed by, for example, LPCVD, and covers the polysilicon layer 16. The inter-poly dielectric layer has a thickness of about 250 Å and includes oxide/nitride/oxide layers. Then, another layer of polysilicon with a thickness of about 3000 Å is formed on the polysilicon layer 16. Both the inter-poly dielectric layer and the polysilicon layer are patterned by photolithography and etching to become an inter-poly dielectric layer 18 and polysilicon layer 20. The polysilicon layer 20 is utilized as a control gate of the flashing memory.

Then, by using the polysilicon layer 20 as a mask, the polysilicon layer 16 is further patterned by etching. A process of implanting ions is next performed by using the polysilicon layer 20 as a mask to form an implantation region 22 with a higher density of doped ions than that of the substrate. A gate electrode of the flash memory includes the polysilicon layer 20, inter-poly dielectric layer 18, polysilicon layer 16 and tunneling oxide layer 12.

Thereafter, the semiconductor substrate is patterned by using a mask (not shown), exposing the implantation region, 22 located at one side of the gate electrode. A process of implanting ions is next performed by using a tilted angle to implant dopant into substrate 10, and a process of annealing is performed to form a diffusion region 24. The diffusion region 24 is located around the implantation region 22, and extends underneath the gate electrode. The implantation region 22 is surrounded by the diffusion region 24. The mask (not shown) is removed after the diffusion region 24 is formed.

Referring to FIG. 3, a layer of oxide is deposited over the whole surface of the substrate structure by using LPCVD. An etching back method is then performed on the oxide layer to form spacers 26 on sidewalls of the gate electrode. Thereafter, an implantation region 28 is formed by implanting ions into the substrate 10 as illustrated in FIG. 3. The cross-sectional view taken along the line II—II in FIG. 3 is still the same as FIG. 5.

Referring to FIGS. 4 and 6, a dielectric layer 30 is formed over the whole substrate structure by using LPCVD. A contact opening 32 is formed on the dielectric layer 30 by lithography and etching to expose the implantation region 22. Then, a metal layer 34 acting as a bit line is formed over the dielectric layer 30 by LPCVD, filling the contact opening 32 so that the metal layer 34, also known as the bit line, is electrically coupled to the implantation region 22. Fabrication of the flash memory is completed in a conventional procedure. This procedure is familiar to those skilled in the art and therefore is not described here.

In the conventional method described above, it is difficult to effectively reduce the flash memory size because it is limited by the contact opening. The existence of the field oxide layer 14 also affects the size reduction and planarization of the active region. Additionally, since the metal layer 34 also has to fill the contact opening 32 in order to serve as the bit line, interference due to signal reflection from the metal layer 34 is inevitable.

SUMMARY OF THE INVENTION

It is therefore an objective of the present invention to provide a method for fabricating flash memory for solving the conventional problems.

In accordance with the foregoing and other objectives of the present invention, the invention provides a method for fabricating a flash memory that includes forming a diffusion region in the substrate at one side of the first polysilicon layer. Formation of the diffusion region is preceded by the following steps: patterning the first polysilicon layer; performing an implantation step to self-align the polysilicon layer, thereby forming implantation regions in the substrate at both sides of the first polysilicon, wherein one implantation region is used for a buried bit line; forming a dielectric layer over the first polysilicon layer; and patterning the second polysilicon layer to form a control gate and further patterning the first polysilicon layer to form a floating gate.

The method for fabricating flash memory of the invention is characterized by the following:

1. A diffusion region is used as a buried bit line. Therefore, there is no need for the contact opening and interference caused by signal reflection from the metal in the contact opening is avoided;

2. In the invention, size is greatly reduced and planarization of the active region is higher in quality because there is no need for the field oxide layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
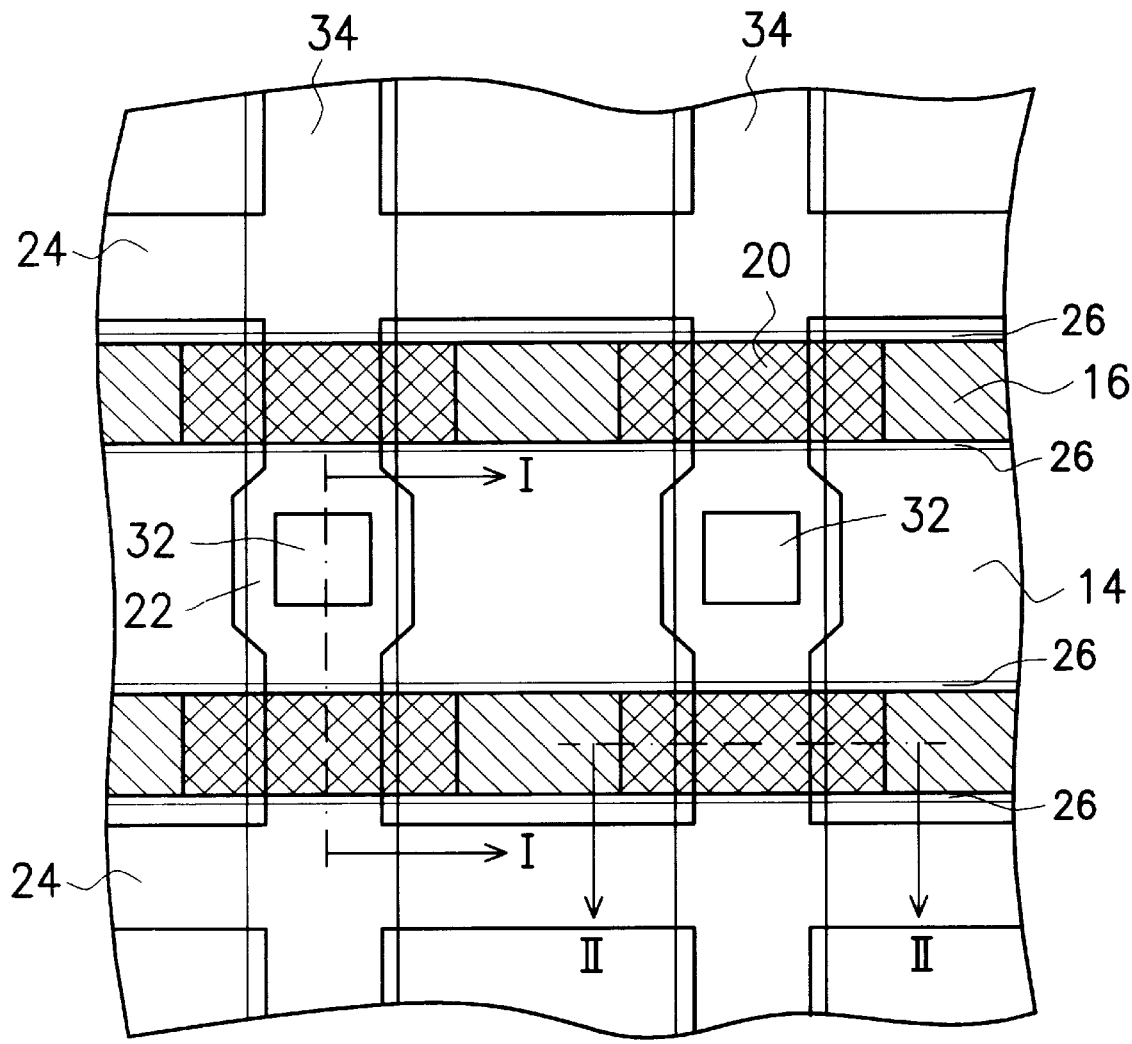
FIG. 1 is a schematic layout of a conventional flash memory.
Figure 2:
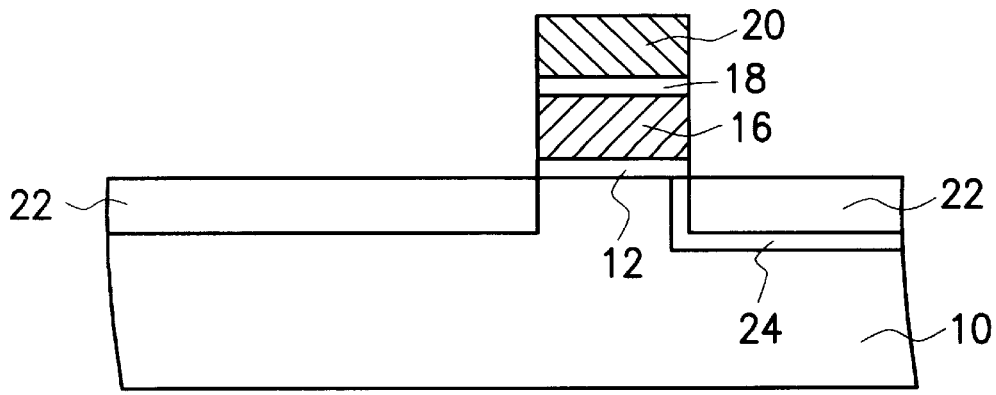
FIGS. 2 to 4 are cross-sectional views taken along the line I—I in FIG. 1, schematically illustrating the fabrication process.
Figure 3:
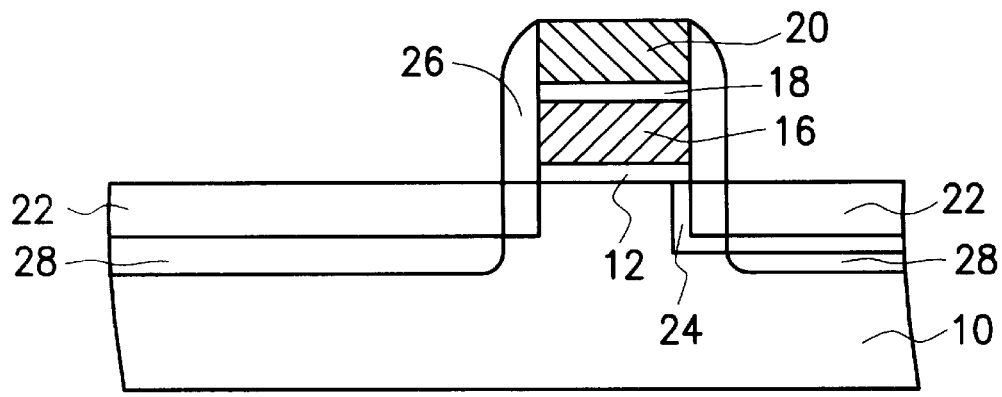
Figure 4:
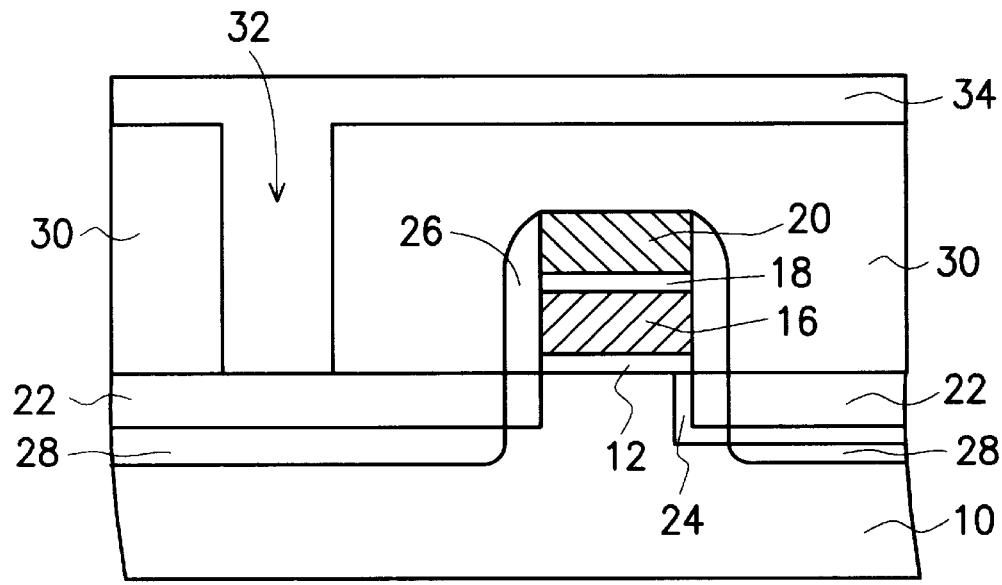
Figure 5:
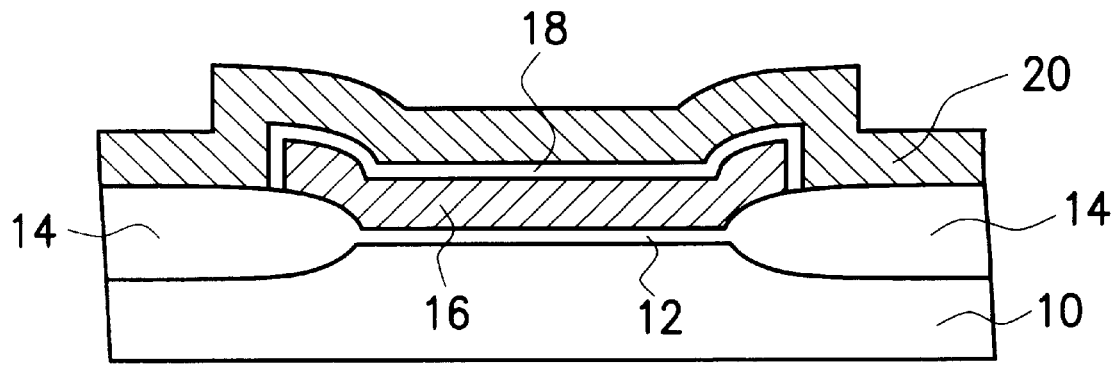
FIGS. 5 to 6 are cross-sectional views taken along the line II—II in FIG. 1, schematically illustrating the fabrication process.
Figure 6:
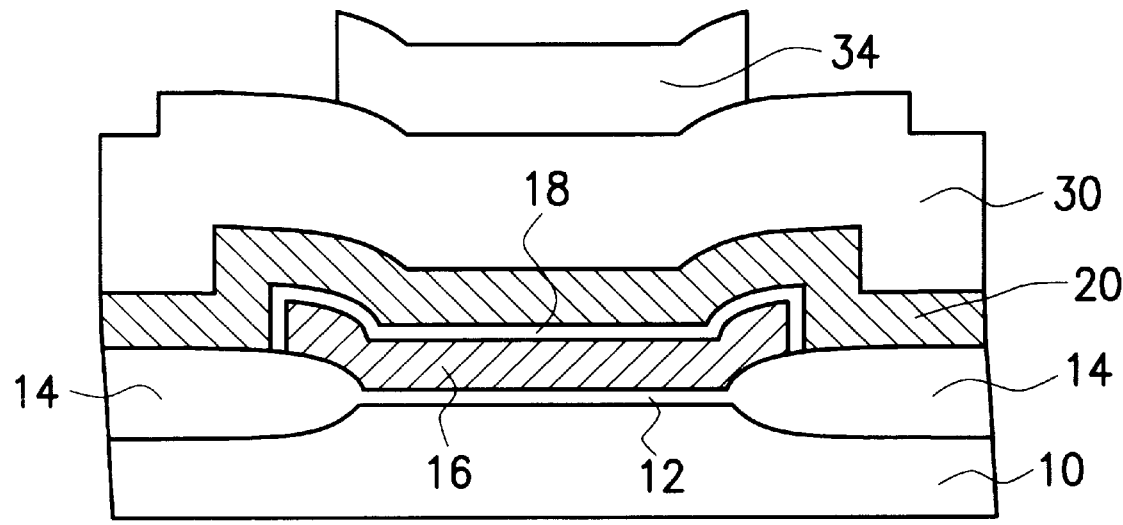
Figure 7:
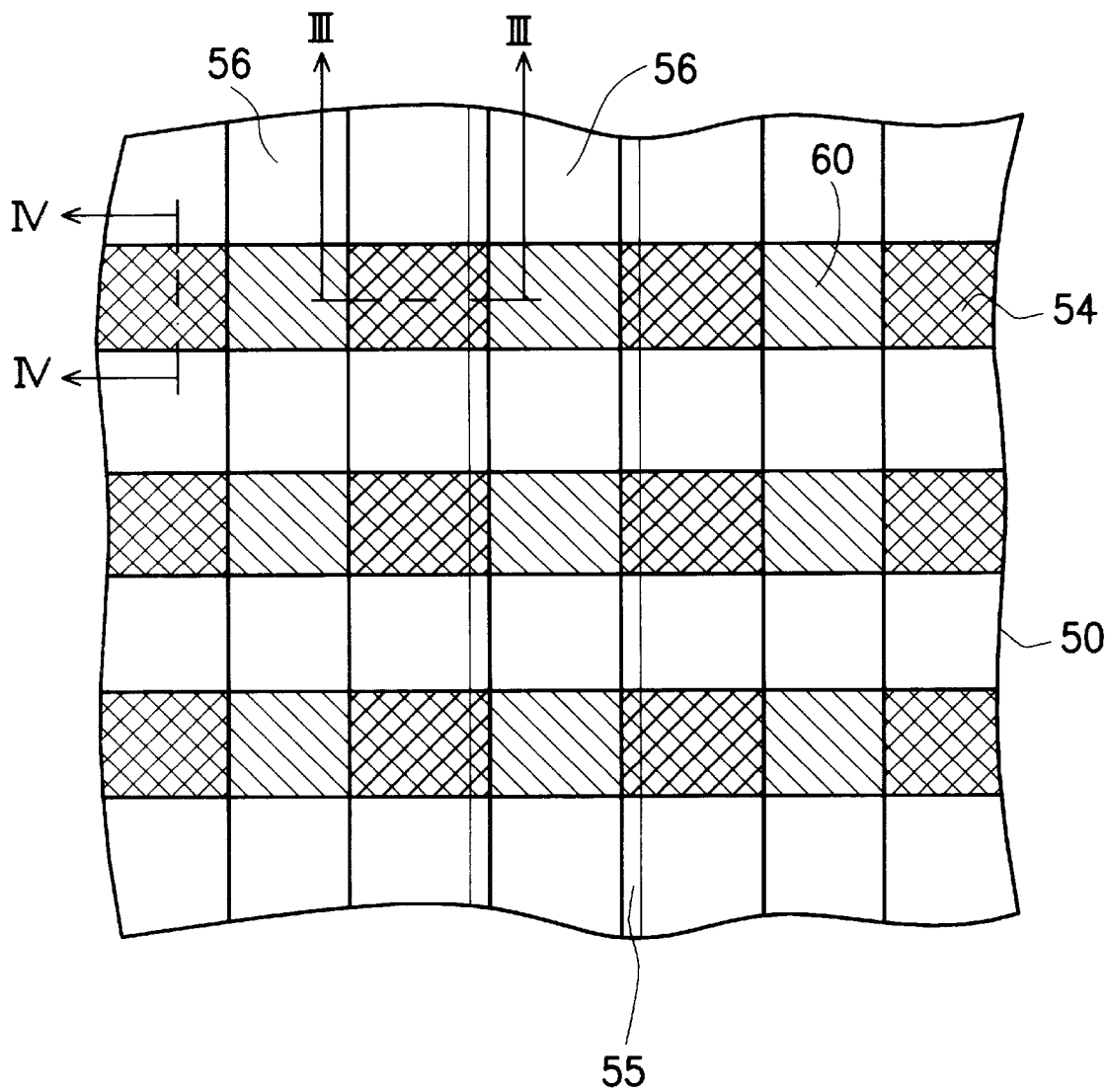
FIG. 7 is a schematic layout of a flash memory according to the preferred embodiment of the invention.
Figure 8:
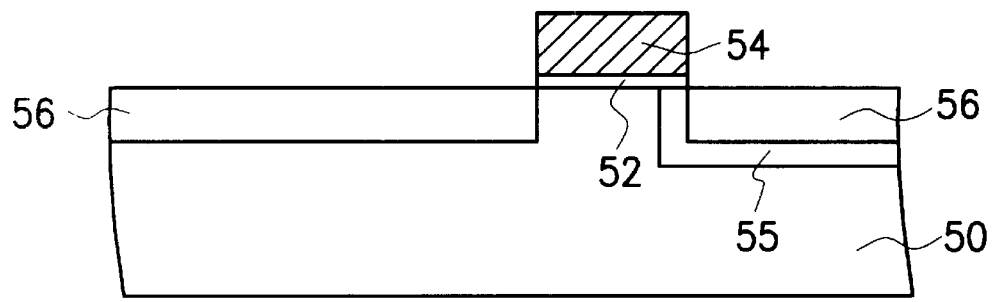
FIGS. 8 to 9 are cross-sectional views taken along the line III—III in FIG. 7 schematically illustrating the fabrication procedure.
Figure 9:
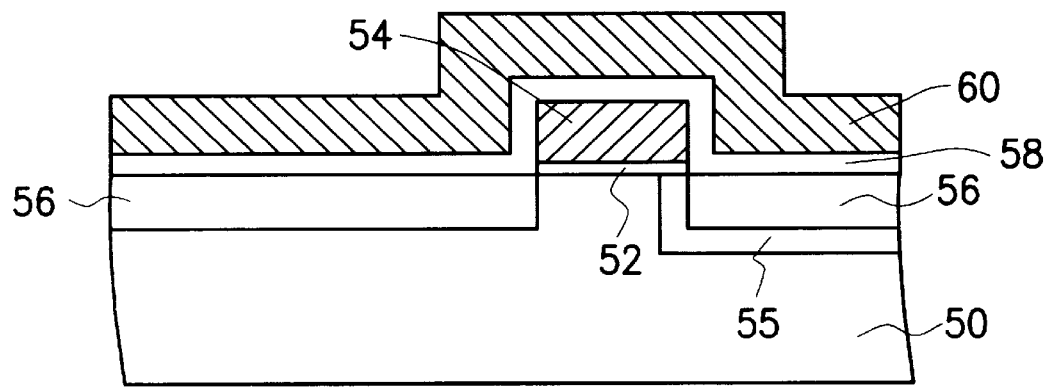
Figure 10:
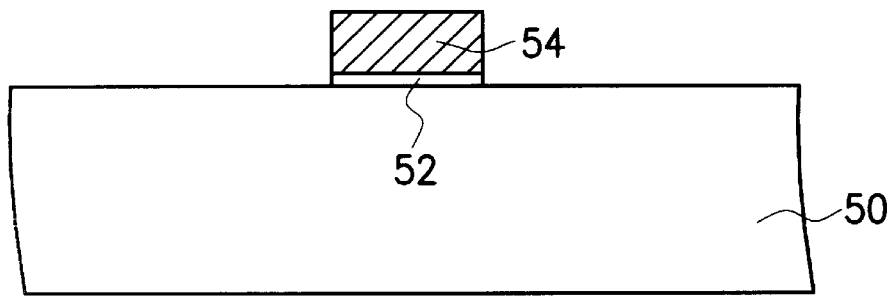
FIGS. 10 to 11 are cross-sectional views taken along the line IV—IV in FIG. 7 schematically illustrating the fabrication procedure.
Figure 11:
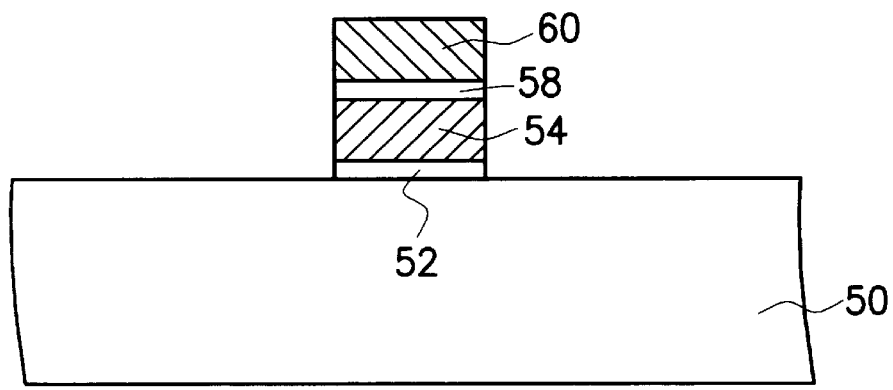

FIG. 7 is a schematic layout of a flash memory according to the preferred embodiment of the invention. FIGS. 8 to 9 are cross-sectional views taken along the line III—III in FIG. 7 schematically illustrating the fabrication procedure. FIGS. 10 to 11 are cross-sectional views taken along the line IV—IV in FIG. 7 schematically illustrating the fabrication procedure.

Referring to FIG. 8 and FIG. 10, a thermal oxidation process is performed on a semiconductor substrate 50 to form a layer of oxide material. Then, polysilicon material is deposited over the oxide material layer by LPCVD, and these two layers are patterned by photolithography and etching to form a polysilicon layer 54 and tunneling oxide layer 52. The surface of the substrate 50 is exposed on both sides of the polysilicon layer 54.

Then, the substrate structure is patterned by a mask (not shown) to selectively expose some portions of the substrate's surface exposed by the polysilicon layer 54. That is, only one side of the exposed surface is exposed. An ion implanting process is performed to implant ions, for example, P ions, into the surface of the substrate 50 exposed by the mask. A process of annealing is performed to form a diffusion region 55. The diffusion region 55 extends laterally into the area below the polysilicon layer 54. The mask (not shown) is removed after the diffusion region 55 is formed.

Then, a self-aligned implanting process is performed by using the patterned polysilicon layer 54 as a mask. Ions, for example, As ions, are doped through the oxide layer 52 into the substrate 50 on both sides of the polysilicon layer 54. A process of annealing is performed to form implantation regions 56. The implantation region 56 on one side of the polysilicon layer 54 is located in diffusion region 55 and is surrounded by the diffusion region 55. The ion dosages of the implantation regions 56 are larger than that of the diffusion region 55.

The characteristic of the invention includes formation of the implantation region 56 acting as a bit line in a self-aligned technology.

Referring to FIGS. 9 and 11, next an inter-poly dielectric material is formed by, for example LPCVD and covers the polysilicon layer 54. The inter-poly dielectric material has a thickness of about 250 Å and includes oxide/nitride/oxide layers. Then, another layer of polysilicon with a thickness of about 3000 Å is formed on the inter-poly dielectric material layer.

The polysilicon layer is patterned by using a mask (not shown) and etching process. The polysilicon layer 60 is utilized as a control gate of the flashing memory. The direction of extension of the polysilicon layer 60 is arrayed with and is about perpendicular to that of the implantation regions 56. Thereafter, the same mask and etching process used in the patterning step of the polysilicon layer, are used again to further etch the polysilicon layer 54 and inter-poly dielectric material layer and form the polysilicon layer 54 and inter-poly dielectric layer 58 as illustrated in FIG. 9. The polysilicon layer 54 is used as a floating gate of the flash memory. The etching step in the patterning process of the polysilicon layer 54 can be a self-aligned etching step. A conventional procedure is followed to complete fabrication of the flash memory. This procedure is familiar to those skilled in the art and therefore is not described here.

In conclusion, the invention uses an ion implanting process in a self-aligned technology, by using the polysilicon layer 54 as a mask to form a buried bit line 56. The contact opening is unnecessary and interference from the signal reflection of metal in the contact opening is avoided.

Moreover, since the field oxide layer is unnecessary in this invention, the size is greatly reduced and a higher quality of planarization of the active region is achieved.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a flash memory, the method comprising:

providing a substrate having an oxide layer;

forming a first polysilicon layer over the oxide layer;

patterning the first polysilicon layer and the oxide layer to thereby expose the substrate by both sides of a patterned first polysilicon layer, wherein the first polysilicon layer is patterned to form the patterned first polysilicon layer;

forming diffusion regions in the substrate at one side of the patterned first polysilicon layer;

forming a plurality of implantation regions in the substrate at both sides of the patterned first polysilicon layer, wherein at one side of each patterned first polysilicon layer the implantation regions are enclosed by the diffusion regions, while at another side of each patterned first polysilicon layers there is no diffusion region formed between the patterned first polysilicon layers;

forming a dielectric layer over the first polysilicon layer; and forming and patterning a second polysilicon layer to form control gates perpendicular to patterned polysilicon layers and further patterning the dielectric layer and the pattered first polysilicon layer, wherein the patterned first polysilicon layer is further patterned to form floating gates, and no isolation structure is formed between the control gates and between the floating gates.

2. The method in claim 1, wherein a portion of each of the diffusion regions underlines the floating gates.

3. The method in claim 1, wherein the step of forming the first polysilicon layer includes using a low pressure chemical vapor deposition method.

4. The method in claim 1, wherein the step of patterning the first polysilicon layer includes using a photolithography and etching method.

5. The method in claim 1, wherein the step of forming the implantation regions further includes performing an implantation step that uses the first polysilicon layer as a mask.

6. The method in claim 5, wherein the implanting step includes using As ions.

7. The method in claim 1, wherein the step of forming the diffusion region further includes exposing the one side of the first polysilicon layer by using a mask to perform an implantation step.

8. The method in claim 7, wherein the implantation step includes using As ions.

9. The method in claim 7, wherein after the implantation step further includes performing a step of removing the mask.

10. The method in claim 1, wherein the step of forming the dielectric layer includes using a low pressure chemical vapor deposition method.

11. The method in claim 1, wherein the step of forming the second polysilicon layer includes using a low pressure chemical vapor deposition method.

12. The method in claim 1, wherein the step of patterning the second polysilicon layer includes using a photolithography and etching method.

13. The method in claim 1, wherein the step of patterning the second polysilicon layer further includes patterning the dielectric layer.

14. The method in claim 1, wherein the step of further patterning the first polysilicon layer further includes using the second polysilicon layer as a mask to etch the first polysilicon layer in a self-aligned process.

15. The method in claim 1, wherein the step of further patterning the first polysilicon layer includes using a photolithography and etching method.

* * * * *